(12) United States Patent
Singhai et al.

(10) Patent No.: US 11,150,984 B2
(45) Date of Patent: *Oct. 19, 2021

(54) SYSTEMS AND METHODS FOR MULTI-ZONE DATA TIERING FOR ENDURANCE EXTENSION IN SOLID STATE DRIVES

(71) Applicant: Western Digital Technologies, Inc., San Jose, CA (US)

(72) Inventors: Ashish Singhai, Los Altos, CA (US); Vijay Karamcheti, Palo Alto, CA (US); Ashwin Narasimha, Los Altos, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/824,508

(22) Filed: Mar. 19, 2020

(65) Prior Publication Data
US 2020/0218603 A1    Jul. 9, 2020

Related U.S. Application Data

(63) Continuation of application No. 14/560,802, filed on Dec. 4, 2014, now Pat. No. 10,691,531.

(51) Int. Cl.
*G06F 11/10* (2006.01)
*G06F 11/00* (2006.01)
(Continued)

(52) U.S. Cl.
CPC ........ *G06F 11/1048* (2013.01); *G11C 29/028* (2013.01); *G11C 29/52* (2013.01);
(Continued)

(58) Field of Classification Search
CPC ... G06F 11/1048; G11C 29/028; G11C 29/52; G11C 2029/0411; H03M 13/353; H03M 13/356; H03M 13/1102; H03M 13/152
See application file for complete search history.

(56) References Cited

U.S. PATENT DOCUMENTS 7,096,313 B1   8/2006   Chang
7,739,576 B2   6/2010   Radke
(Continued)

OTHER PUBLICATIONS

Cai et al., "Flash Correct-and-Refresh: Retention-Aware Error Management for Increased Flash Memory Lifetime," DSSC, Carnegie Mellon University, pp. 1-8 (no date listed).
(Continued)

*Primary Examiner* — Justin R Knapp
(74) *Attorney, Agent, or Firm* — Morgan, Lewis & Bockius LLP (57) ABSTRACT

Systems and methods for increasing the endurance of a solid state drive are disclosed. The disclosed systems and methods can assign different levels of error protection to a plurality of blocks of the solid state drive. The disclosed methods can provide a plurality of error correction mechanisms, each having a plurality of corresponding error correction levels and associate a first plurality of blocks of the solid state drive with a first zone and a second plurality of blocks of the solid state drive with a second zone. The disclosed methods can assign a first error correction mechanism and a first corresponding error correction level to the first zone and can assign a second error correction mechanism and a second corresponding error correction level to the second zone.

18 Claims, 6 Drawing Sheets

(51) Int. Cl.
    *H03M 13/35*    (2006.01)
    *H03M 13/00*    (2006.01)
    *G11C 29/52*    (2006.01)
    *G11C 29/02*    (2006.01)
    *H03M 13/11*    (2006.01)
    *H03M 13/15*    (2006.01)
    *G11C 29/04*    (2006.01)

(52) U.S. Cl.
    CPC ....... *H03M 13/353* (2013.01); *H03M 13/356* (2013.01); *G11C 2029/0411* (2013.01); *H03M 13/1102* (2013.01); *H03M 13/152* (2013.01)

(56) References Cited

U.S. PATENT DOCUMENTS

| | | | |
|---|---|---|---|
| 7,904,780 | B2 | 3/2011 | Brandman |
| 7,953,931 | B2 | 5/2011 | Yu et al. |
| 8,161,354 | B2 | 4/2012 | Chen |
| 8,209,466 | B2 | 6/2012 | Garratt |
| 8,327,226 | B2 | 12/2012 | Rub |
| 8,583,868 | B2 | 11/2013 | Belluomini et al. |
| 8,621,141 | B2 | 12/2013 | Mudama |
| 8,650,461 | B2 | 2/2014 | Shalvi et al. |
| 8,910,017 | B2 | 12/2014 | Sharon |
| 8,929,140 | B2 | 1/2015 | Nagashima |
| 9,015,561 | B1 | 4/2015 | Hu |
| 9,442,670 | B2 | 9/2016 | Kruger |
| 9,477,587 | B2 | 10/2016 | Wong |
| 9,524,786 | B2 | 12/2016 | Nagashima |
| 9,785,370 | B2 * | 10/2017 | Lomnes ............... G06F 3/065 |
| 2004/0153718 | A1 * | 8/2004 | Shen ............... G06F 11/2087 |
| | | | 714/5.11 |
| 2008/0195900 | A1 | 8/2008 | Chang |
| 2008/0209114 | A1 | 8/2008 | Chow et al. |
| 2008/0279005 | A1 | 11/2008 | France |
| 2009/0013233 | A1 | 1/2009 | Radke |
| 2009/0070651 | A1 | 3/2009 | Diggs |
| 2010/0100797 | A1 | 4/2010 | Chen |
| 2010/0115376 | A1 | 5/2010 | Shalvi |
| 2010/0246266 | A1 | 9/2010 | Park |
| 2011/0060967 | A1 | 3/2011 | Warren |
| 2011/0060968 | A1 | 3/2011 | Warren |
| 2011/0167319 | A1 | 7/2011 | Jeddeloh |
| 2011/0238899 | A1 | 9/2011 | Yano |
| 2011/0252289 | A1 | 10/2011 | Patapoutian |
| 2012/0151301 | A1 | 6/2012 | Izumi |
| 2012/0272123 | A1 | 10/2012 | Yeh |
| 2012/0313873 | A1 | 11/2012 | Nguyen |
| 2013/0013860 | A1 * | 1/2013 | Franceschini ......... G06F 12/00 |
| | | | 711/118 |
| 2013/0054928 | A1 | 2/2013 | Im |
| 2013/0061019 | A1 | 3/2013 | Fitzpatrick et al. |
| 2013/0179740 | A1 | 7/2013 | Jeddeloh |
| 2013/0227203 | A1 | 8/2013 | Marotta |
| 2014/0006688 | A1 | 1/2014 | Yu |
| 2014/0082460 | A1 | 3/2014 | Pangal et al. |
| 2014/0101379 | A1 | 4/2014 | Tomlin |
| 2014/0136927 | A1 | 5/2014 | Li |
| 2015/0058697 | A1 | 2/2015 | Iwasaki |
| 2015/0089317 | A1 | 3/2015 | Patapoutian |
| 2015/0347029 | A1 | 12/2015 | Kotte |
| 2016/0041870 | A1 | 2/2016 | Davis |
| 2016/0062663 | A1 | 3/2016 | Samuels |

OTHER PUBLICATIONS

Chang et al., "A commitment-based management strategy for the performance and reliability enhancement of flash-memory systems," 2009 46th ACM/IEEE Design Automation Conference, San Francisco, CA, 2009, pp. 858-863.

Chen et al., "An Adaptive-Rate Error Correction Scheme for NAND Flash Memory," 2009 27th IEEE VLSI Test Symposium, Santa Cruz, CA, 2009, pp. 53-58.

Gabrys et al., "Spatially-aware adaptive error correcting codes for flash memory," 2011 Conference Record of the Forty Fifth Asilomar Conference on Signals, Systems and Computers (ASILOMAR), Pacific Grove, CA, 2011, pp. 28-32.

Lin et al., "A Low power and ultra high reliability LDPC error correction engine with Digital Signal Processing for embedded NAND Flash Controller in 40nm COMS," 2014 Symposium on VLSI Circuits Digest of Technical Papers, Honolulu, HI, 2014, pp. 1-2.

Liu et al., "PCM-FTL: A Write-Activity-Aware NAND Flash Memory Management Scheme for PCM-Based Embedded Systems," IEEE Xplore Digital Library, Abstract, Retrieved online [URL:<http://ieeexplore.ieee.org/xpl/login.jsp?tp=arnumber=61214-09&url=http%3A%2F%2Fieeexplore.ieee.org%2Fxpls%2Fabs_all.jsp%3Farnumber%3D-6121409>], 2 pages (Retrieved on Jul. 2, 2014).

Ryan, "Micron P320H HHHL 700GB PCIE Enterprise SSD Review Unbelievable IOPS and Absurd Endurance," Retrieved online, [URL: http://www.thessdreview.com/our-reviews/micron-p320h-hhhl-700gb-pcie-enterprize-ss . . . >], Retrieved on Jul. 2, 2014 (3 pages).

White Paper, WP001—Flash Management: A detailed overview of flash management techniques, SanDisk, 18 pages (Nov. 2013).

* cited by examiner

SYSTEMS AND METHODS FOR MULTI-ZONE DATA TIERING FOR ENDURANCE EXTENSION IN SOLID STATE DRIVES

CROSS-REFERENCE TO RELATED APPLICATIONS

This application is a continuation of application Ser. No. 14/560,802, filed Dec. 4, 2014, now U.S. Pat. No. 10,691,531, which is related to U.S. patent application Ser. No. 14/560,767, filed Dec. 4, 2014, now U.S. Pat. No. 10,067,823, the entirety of each of which is incorporated herein by reference for all purposes.

FIELD

The present disclosure relates to systems and methods for extending solid state drives endurance (operational lifetime), and more specifically to systems and methods for multi-zone data tiering for endurance extension in solid state drives.

BACKGROUND

Flash memory devices are widely used for primary and secondary storage in computer systems. The density and size of flash memory has increased with semiconductor scaling. Consequently, the cell size has decreased, which results in low native endurance for next generation commodity flash memory devices. Low endurance of flash memory devices could severely limit the applications that flash memories could be used for and have severe impacts for solid state drive (SSD) applications.

Accordingly, endurance management techniques that extend the endurance of solid state drive are required.

SUMMARY

Systems and methods for increasing the endurance of a solid state drive having a plurality of blocks by assigning different levels of error protection are provided. According to aspects of the present disclosure a method for increasing the endurance can include providing a plurality of error correction mechanisms, each having a plurality of corresponding error correction levels and associating a first plurality of blocks of the solid state drive with a first zone and a second plurality of blocks of the solid state drive with a second zone. The method can also include assigning a first error correction mechanism and a first corresponding error correction level to the first zone and assigning a second error correction mechanism and a second corresponding error correction level to the second zone.

According to aspects of the present disclosure a memory controller configured to increase the endurance of a solid state drive can include a controller module configured to communicate with a solid state drive having a plurality of blocks and provide a plurality of error correction mechanisms, each having a plurality of corresponding error correction levels. The controller module can further be configured to associate a first plurality of blocks of a solid state drive having a plurality of blocks and in communication with the memory controller with a first zone and a second plurality of blocks of the solid state drive with a second zone, assign a first error correction mechanism and a first corresponding error correction level to the first zone, and assign a second error correction mechanism and a second corresponding error correction level to the second zone.

These and other embodiments will be described in greater detail in the remainder of the specification referring to the drawings.

DESCRIPTION

According to aspects of the disclosure, systems and methods extend the endurance of a solid state drive by assigning the solid state drive blocks into one or more error correction zones, and applying an appropriate error correction mechanism and corresponding error correction level to the blocks of the particular zone. In addition, the disclosed methods manage the solid state drive traffic, such that traffic with particular error correction requirements are directed to the appropriate zone.

Figure 1:
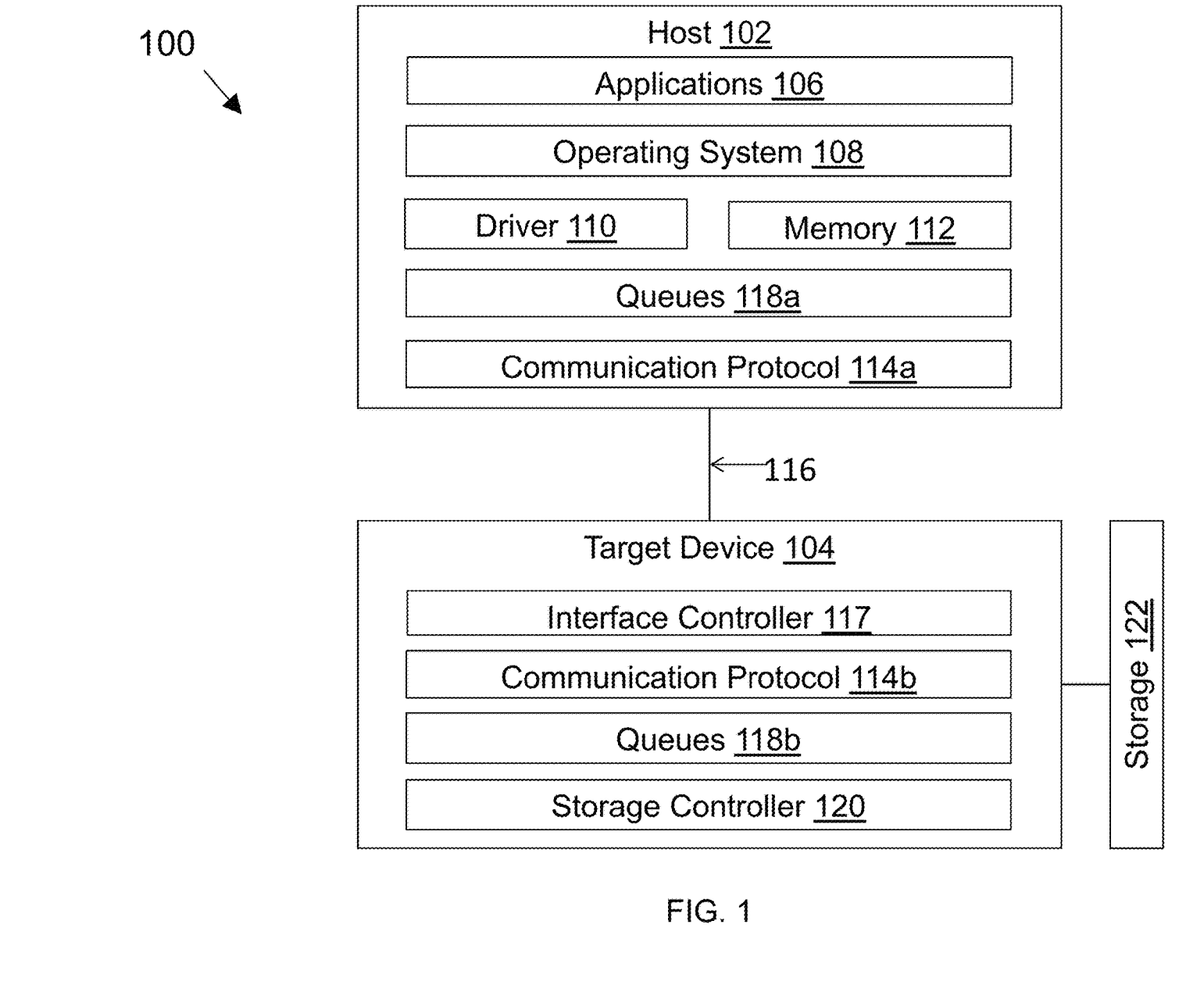
FIG. 1 illustrates an exemplary system implementing a communication protocol, in accordance with embodiments of the present disclosure.

FIG. 1 illustrates an exemplary system 100 implementing a communication protocol, in accordance with some embodiments of the present disclosure. System 100 can include host 102 in communication with target device 104 and storage 122. Host 102 can include user applications 106, operating system 108, driver 110, host memory 112, queues 118a, and communication protocol 114a. Target device 104 can include interface controller 117, communication protocol 114b, queues 118b, and storage controller 120 in communication with storage 122. According to aspects of the present disclosure, an SSD controller, for example storage controller 120 can include logic for implementing error correction during data retrieval from storage 122. For example, storage controller 120 can implement one or more error correction code (ECC) engines that implement the error correction scheme of system 100.

Host 102 can run user-level applications 106 on operating system 108. Operating system 108 can run driver 110 that interfaces with host memory 112. In some embodiments, memory 112 can be dynamic random access memory (DRAM). Host memory 112 can use queues 118a to store commands from host 102 for target 104 to process. Examples of stored or enqueued commands can include read operations from host 102. Communication protocol 114a can allow host 102 to communicate with target device 104 using interface controller 117.

Target device 104 can communicate with host 102 using interface controller 117 and communication protocol 114b. Communication protocol 114b can provide queues 118 to access storage 122 via storage controller 120.

Figure 2:
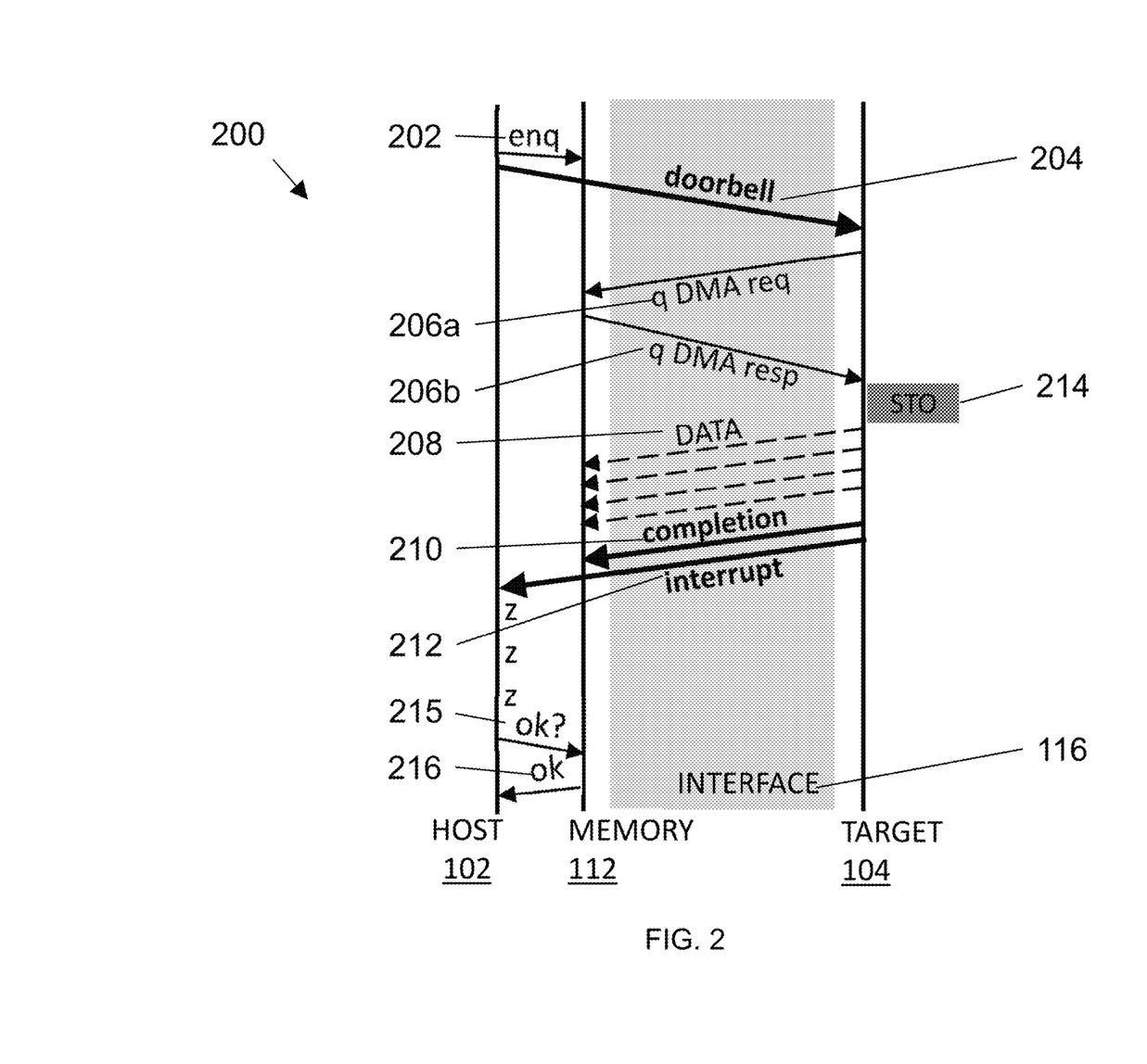
FIG. 2 illustrates an example message flow of a Non-Volatile Memory Express (NVMe)-compliant read operation, in accordance with embodiments of the present disclosure.

FIG. 2 illustrates an exemplary message flow 200 of a communication protocol, in accordance with aspects of the present disclosure. FIG. 2 illustrates host 102 in communication with host memory 112 and target 104 over interface 116. For example, interface 116 can implement an NVM Express (NVMe) communication protocol and can implement error detection and correction. Those skilled in the art would understand that the communication protocol is not restricted to NVME but other proprietary protocols are possible as well.

The message flow and timing diagram shown in FIG. 2 is for illustrative purposes. Time is generally shown flowing down, and the illustrated timing is not to scale. The communication protocol for reading a block from target 104 can begin with host 102 preparing and enqueuing a read command in host memory 112 (step 202) and initiating the transaction by sending a "doorbell" packet (step 204) over interface 116 (e.g., PCI Express). The doorbell signals the target device that there is a new command waiting, such as a read command. In response, the target device can initiate a direct memory access (DMA) request—resulting in transmission of another PCI Express packet—to retrieve the enqueued command from the queue in memory 112 (step 206a).

Specifically, host 102 can enqueue ("enq") a command (step 202) such as a read command, and can ring a command availability signal ("doorbell") (step 204). In some embodiments, host 102 can include a CPU that interacts with host memory 112. The doorbell signal can represent a command availability signal that host 102 uses to indicate to the device that a command is available in a queue in memory 112 for the device to retrieve. In response to receiving the doorbell signal, the device can send a command request to retrieve the queue entry (step 206a). For example, the command request can be a direct memory access (DMA) request for the queue entry. The device can receive the requested entry from the queue (step 206b). For example, the device can receive the DMA response from memory 112 on host 102. The device can parse the command in the queue (e.g., the read command), and execute the command. For example, the device can send the requested data packets to memory 112 (step 208). Rectangle 214 illustrates an amount of time when the device actually reads storage data. Reading data from storage requires implementing error correction schemes while retrieving the data from the storage device memory cells. Error correction schemes ensure that data from storage is retrieved error free.

After the device has completed sending the requested data, the device can write an entry, or acknowledgement signal, into a completion queue (step 210). The device can further assert an interrupt that notifies the host that the device has finished writing the requested data (step 212). A thread on the CPU on host 102 can handle the interrupt. From the time the interrupt signal reaches the CPU on host 102, it can take many cycles to do the context switch and carry on with the thread that was waiting for the data from target 104. Hence, the thread can be considered as if it is "sleeping" for a few microseconds after the interrupt arrives. Subsequently, when the CPU on the host 102 wakes up, it can query the host memory 112 to confirm that the completion signal is in fact in the completion queue (step 215). Memory 112 can respond back to the host CPU with a confirmation when the completion signal is in the completion queue (step 216).

As discussed above, retrieving data from NVM storage device 122, involves implementing error correcting schemes that ensure that the data from storage is retrieved error free. Different error correcting schemes, for example, BCH (from the acronym of the code inventors, Raj Bose, D. K. Ray-Chaudhuri, and Alexis Hocquenghem) and low-density parity-check (LDPC) code, have different performance and area requirements. Error correction in flash memories is costly, because implementing it requires area, for example, for storing codewords. Error correction also reduces performance of the flash drive, because of the extra computation for the coding and decoding that is required for writing and reading data from cells. An ECC implementation that can provide significant error corrections can require a significant portion of the storage device and can also have an adverse effect on performance, because sophisticated error correction algorithm can be time consuming. Therefore, there are different trade-offs associated with each particular ECC implementation, that typically relate to (1) space efficiency of the implementation, for example, an ECC implementation that provides high level of error correction may require a lot of flash drive area to store the ECC codewords, (2) latency of the error correction mechanism, for example, an ECC implementation with a sophisticated error correction algorithm may require many cycles to run, (3) the error correction capability, for example, elaborate ECC implementation may be able to correctly retrieve data from flash memory cells with deteriorated integrity, and (4) architectural decisions, that relate, for example, to the number of error correction engine modules and the size of each module.

Balancing these tradeoffs usually determines the type of the ECC mechanism implemented in a flash memory device. Typical error correction implementations may partition the flash memory into different partitions and assign a single type of ECC mechanism to each partition, for example, BCH for each partition. However, the ability of a storage device to return error free data deteriorates over time. Therefore, an ECC mechanism that is appropriate for a flash storage device at the beginning of life of the storage device, when the flash memory error count is low, may not be appropriate near the end of life of the storage device, when the error count is significantly higher. If the error correction mechanism cannot provide adequate error correction for the particular partition, then the partition may no longer be used. In some cases, when a partition is rendered unusable, the memory device may need to be replaced.

In addition, not all area of the flash storage device deteriorates equally with time. Flash storage cells of the same partition within the flash storage device can exhibit different error counts. The difference in the error counts of the flash memory cells is a function of many parameters, for example, fabrication technology, cell impurities, and cell usage. For example, if one cell has more impurities compared to another cell in the same partition within the flash storage device, then it will exhibit a higher number of error counts compared to a cell with less impurities. Moreover, cells that are accessed more frequently, because, for example, of read-write traffic patterns, can also exhibit a higher number of error counts compared to others who are less frequently accessed. Accordingly, dividing the flash memory into physical partitions and assigning a particular ECC mechanism to each partition, may therefore not be very efficient.

Moreover, some applications may require groups of flash memory blocks to offer different error correction levels. For example, an application might require two error correction levels, and can assign 80% of the flash memory to a low error correction level, and the remaining 20% of the flash memory to a high error correction level. Dividing the flash memory into two partitions may not be so efficient, if, for example, another application required a different type of allocation. Moreover, as explained above, flash memory blocks can deteriorate at different speeds. If one of the blocks allocated into the group with the high error correction level and started to deteriorate faster than the other blocks of the group, then the entire partition might not be appropriate for the particular application.

Instead of dividing the flash memory blocks into physical partitions, the disclosed methods assign them into different zones and assign different endurance capabilities to those zones. Accordingly, no physical partition of the flash memory takes place; rather a zone can be logical or virtual accumulation of blocks. Different applications can determine how many zones they can use and the level of error correction that each zone can offer. For example, the flash drive can be divided into a high-endurance (HE) zone and a low-endurance (LE) zone, and each zone need not be contiguous.

Figure 3A:
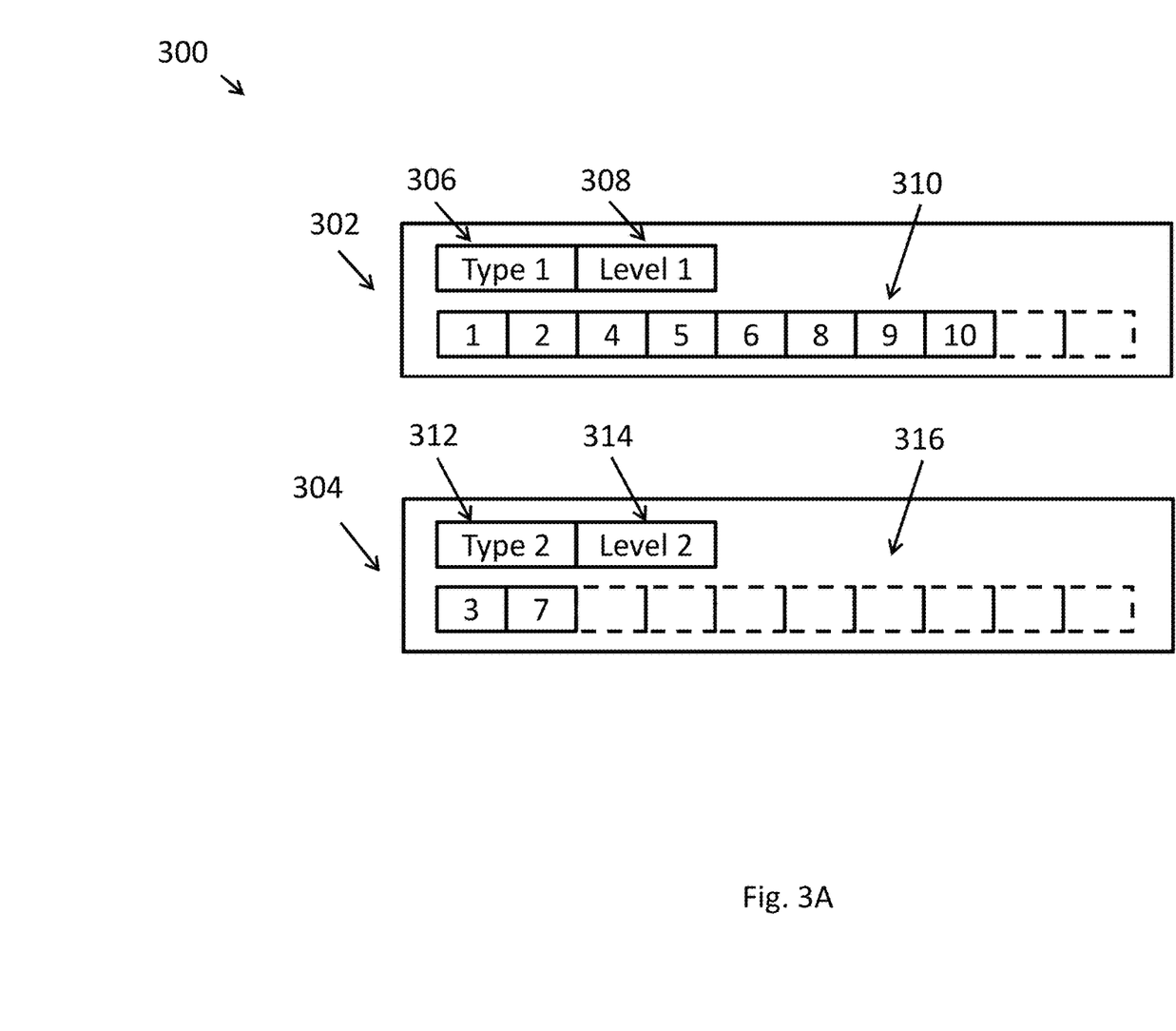
FIGS. 3A-3B show exemplary implementations of two zones, in accordance with embodiments of the present disclosure.
Figure 3B:
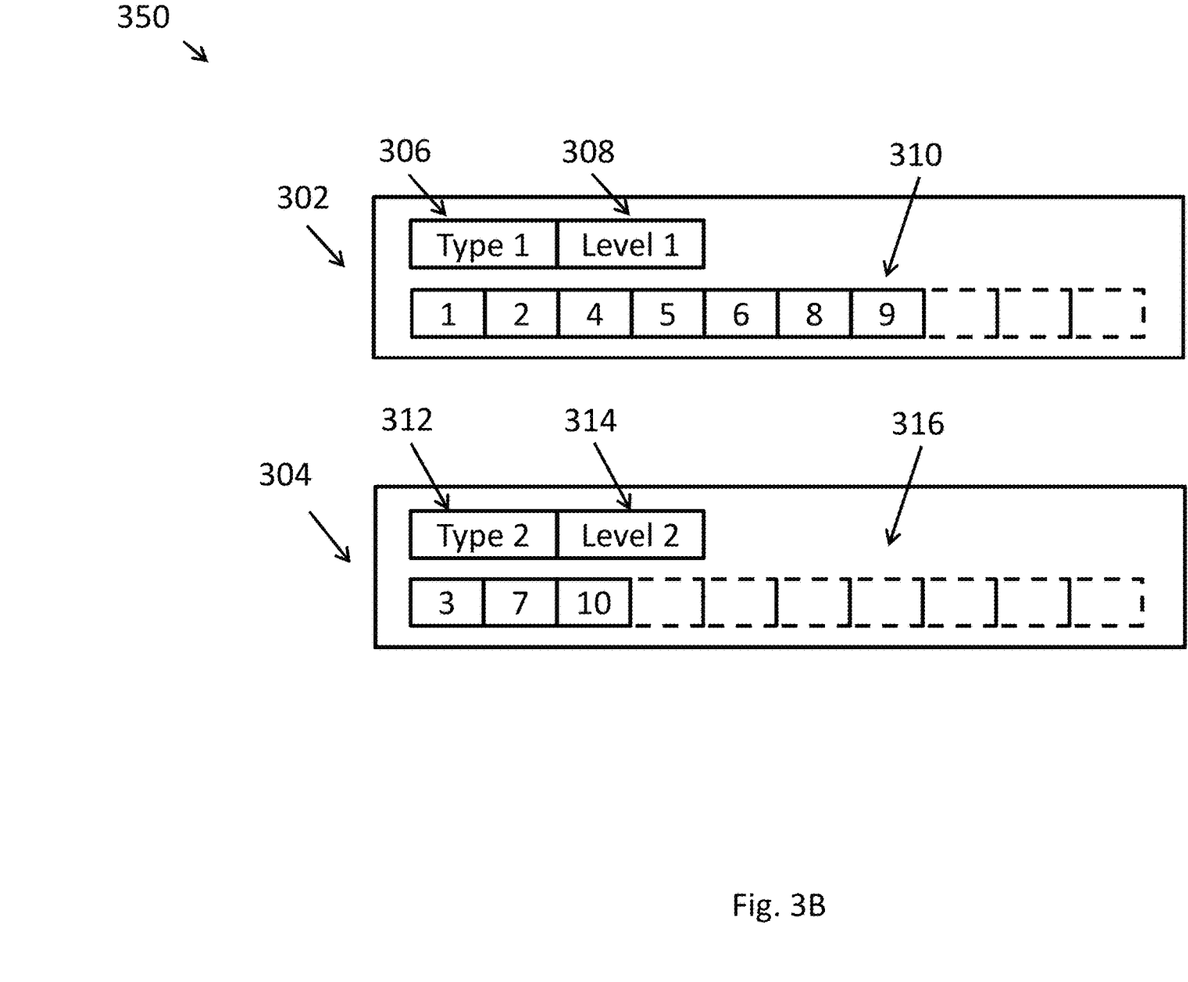

FIGS. 3A and 3B show exemplary implementations of zones according to aspects of the disclosure. Specifically, FIGS. 3A and 3B show zones as dynamic arrays that contain information about the type and level of the particular error correction associated with each zone and identifications of the blocks that are assigned to the particular zone. FIG. 3A, generally at 300 shows a first zone 302 and a second zone 304. Both zones have entries (306, 312) that specify the type of error correction that is associated with each zone, as well as, entries (308, 314) for the particular level of error correction for the zone. In addition, both zones have entries (310, 316) that identify the flash memory blocks that are assigned to each zone. In the example illustrated in FIGS. 3A and 3B, the flash memory has ten blocks. In FIG. 3A, there are eight blocks 310 associated with the first zone 302 and two blocks 316 associated with the second zone 304. As discussed above, the disclosed methods allow the reallocation of blocks to a more appropriate zone, based on the different error corrections associated with each zone. This is shown in FIG. 3B. FIG. 3B shows an updated assignment 350 of the flash memory blocks to the two zones. Specifically, block with id 10 has been reassigned to the second zone 304. Accordingly, after the reassignment, there are seven blocks 310 associated with the first zone 302 and three blocks 316 associated with the second zone 304. According to aspects of the disclosure, the first zone can be smaller than the second zone. The first zone can cover, for example, at least 10% of the solid state drive capacity.

Figure 4:
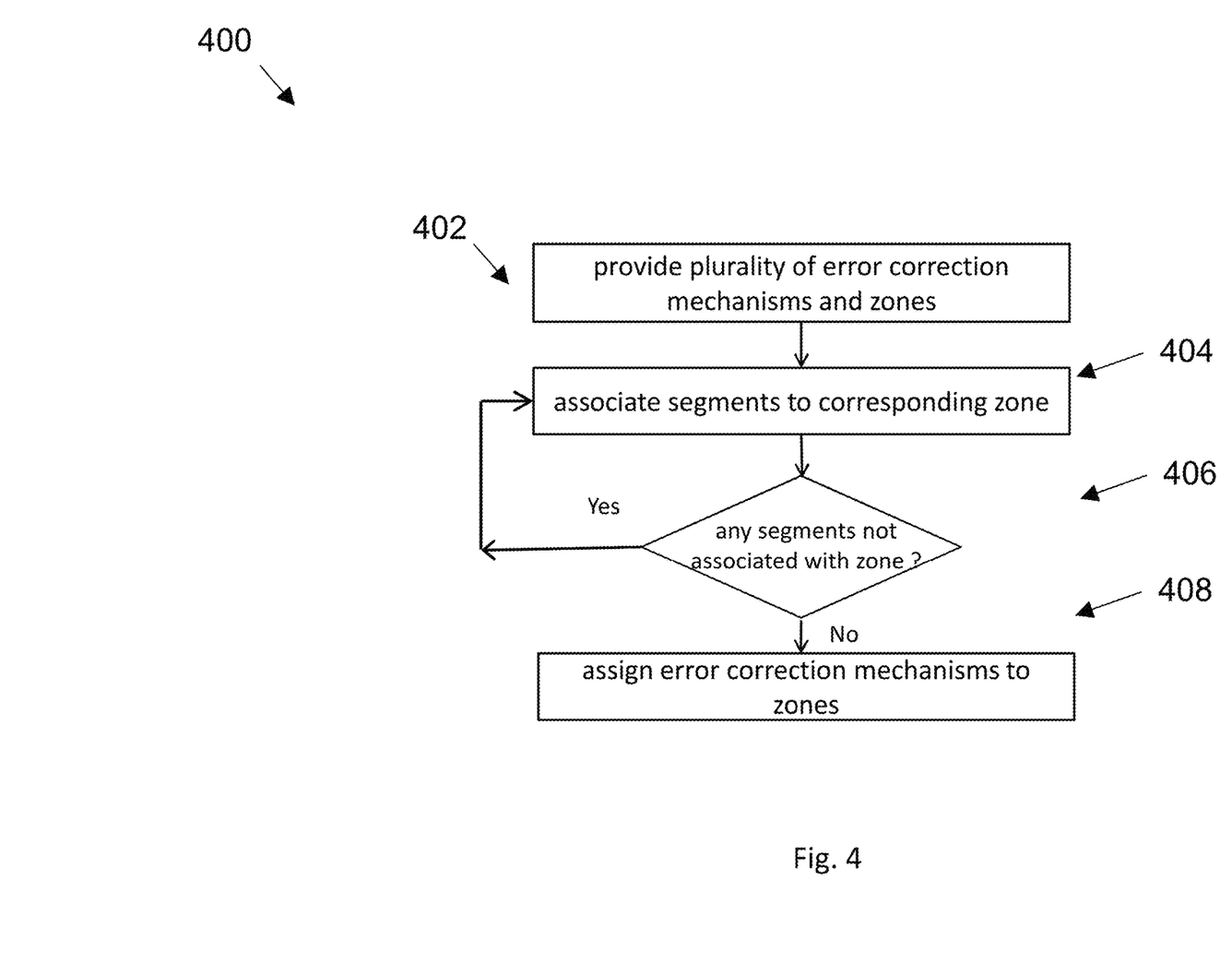
FIG. 4 shows an exemplary method, in accordance with embodiments of the present disclosure.

The example with the two zones in FIGS. 3A and 3B is merely illustrative. A person of ordinary skill would understand that different implementation can have more than two zones with different types and levels of error correction. For example, FIG. 4 illustrates an exemplary method 400 for assigning different blocks into any number of appropriate zones, and therefore, increasing the endurance of the flash memory. Specifically, the method of FIG. 4 provides a plurality of error correction mechanisms and zones 402. The method then starts associating the flash memory blocks into corresponding zones 404. At 406, the method checks whether there are any flash memory blocks that have not been associated with a corresponding zone. If there are, then the method continues associating those blocks. If there are no blocks that are not associated with a particular zone, then the method assigns appropriate error correction mechanism to the zones (408).

Having different zones simplifies directing traffic into the flash memory by directing it into the zone with the appropriate error correction and endurance for a particular write access pattern. For example, choosing the appropriate zone to direct traffic to can extend the flash memory device. For example, data that is not frequently overwritten can be assigned to a low endurance zone. Because, typically, low endurance zones include blocks with weak cells, assigning data that is not frequently overwritten does not impose additional stress to those cells. In contrast, data that is overwritten frequently can be assigned to a high endurance zone. Information about the transient behavior of the data can be obtained by analyzing the generated traffic of particular application types. For example, some applications generate a lot of transient data that can be overwritten frequently. Information about the transient behavior of the data can also be obtained by observation. For example, a storage controller can observe which data or file is overwritten frequently and store this information. Finally, information about the transient behavior of the data can also be obtained through garbage collection. For example, during garbage collection, the storage controller can collect information about which data or file is frequently overwritten. Garbage collection is a background activity on the controller can remove invalid data from the flash and compact and/or free up contiguous flash area for new write operations.

As discussed above, directing traffic appropriately to a high-endurance or a low-endurance zone according the write access pattern can extend the endurance of a flash memory. Traffic patterns can result in different levels of write amplification and over-provisioning for particular blocks. To better understand the connection between the endurance and traffic patterns, a brief discussion of the endurance of the flash device is provided and how it relates to write amplification and over-provisioning. The endurance of flash memory devices is linked to the write amplification phenomenon. Write amplification (WA) is a phenomenon associated with flash memory and solid-state drives (SSDs) where the actual amount of physical information written is a multiple of the logical amount that is intended to be written into the memory. Accordingly, increased write amplification at a particular block can result in a rapid deterioration of the endurance of the block, because of the extra amount of physical information that is written into the block.

In the storage context, over-provisioning means allocating a portion of the total flash memory available to the flash storage processor, for performing various memory management functions. Alternatively, over-provisioning is the inclusion of extra storage capacity in a solid state drive, because the portion of the flash memory that is allocated to the flash storage processor is not visible to the host as available storage. This leaves less usable capacity for storage of data, but results in better performance and endurance. There is an exponential increase in write amplification with decreasing write over-provisioning, so small increases in over-provisioning can yield significant reductions in write amplification.

Therefore, the amount of write amplification for a particular block depends on the 'randomness' in the write access pattern. A random write pattern, results in many overwrites, which in turn results in more write amplification. In addition, the amount of write amplification for a particular block depends on the write overprovisioning or garbage collection reserve/margin. Specifically, the amount of write amplification is inversely proportional to the amount of over provisioning—the more the overprovisioning, the less the write amplification.

As discussed above, it is desirable to reduce the overall write amplification seen by the device. The reduction of the overall write amplification can generally improve random write performance or increase the specified endurance. According to aspects of the disclosure, the different disclosed zones can be differentiated either by the endurance levels they support, as described above, or by the amount of write overprovisioning associated with them, which in turn influences the write amplification, and hence the endurance. In addition, according to some aspects of the disclosure, writes that are likely to create more write amplification can be directed to higher endurance zones.

Benefits of Multiple Endurance Zones

For illustration purposes, let us consider a card with 24 channels and 20 nm Octal Die Package (ODP) consumer multi-level cell (cMLC) flash. Octal Die Package (ODP) refers to packages of NAND flash which have eight dies contained within. This card would have a 3,072 GB total capacity. With a 28% write over provisioning (OP) the device exposes a total memory capacity of 2,211 GB to the user. This level of over provisioning provides a measured effective WA of 4.5 for a random 4 KB write pattern. This value of WA was measured by running a number of datasets over the card and recording the ratio of media writes to user writes.

Figure 5:
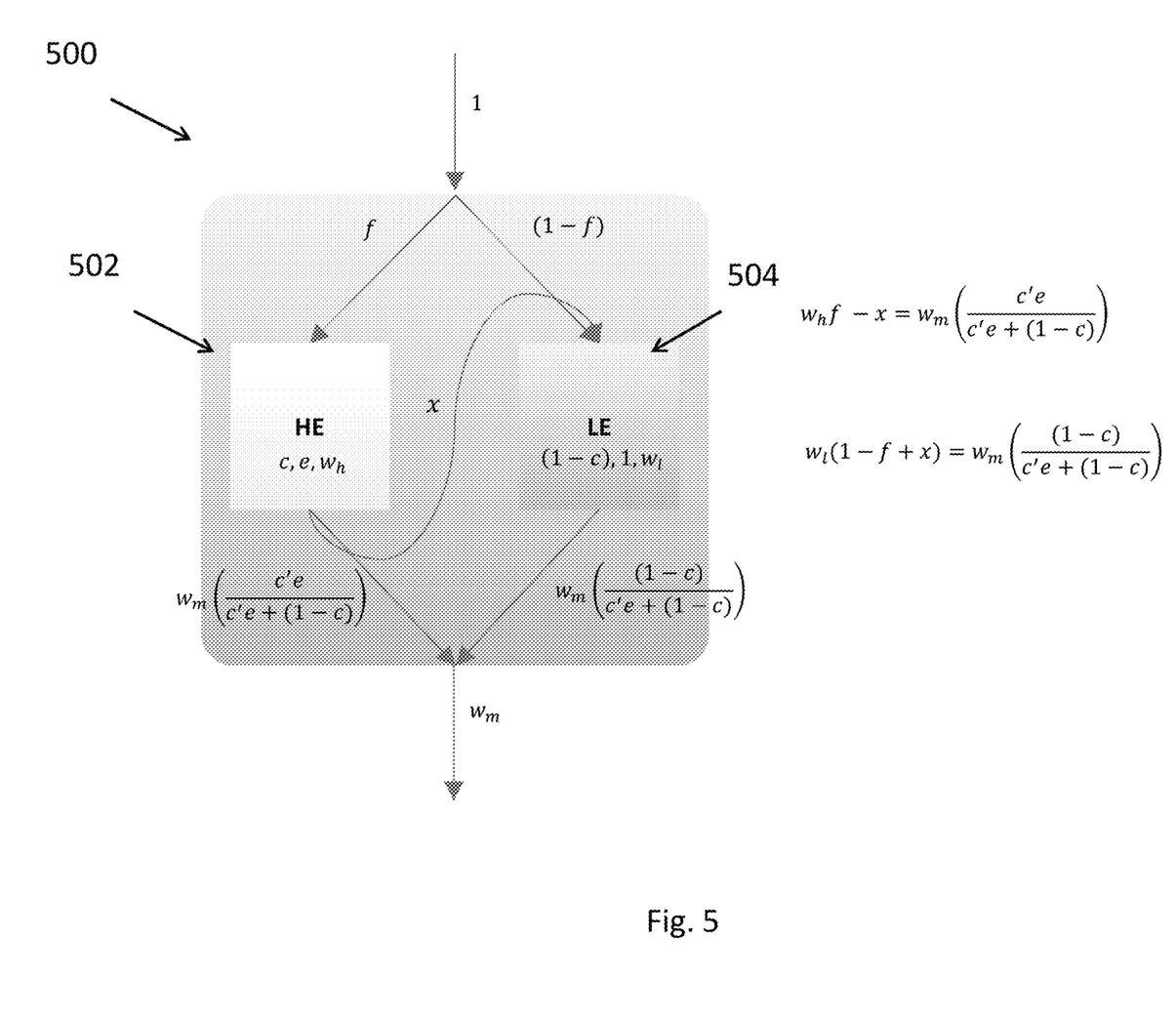
FIG. 5 shows a two-zone model illustrating traffic management between two endurance zones, in accordance with embodiments of the present disclosure.

FIG. 5 depicts a two-zone model 500 that illustrates how multiple endurance zones combined with traffic management may help reduce the overall write amplification. Specifically, FIG. 5 shows a system built out of a high endurance (HE) zone 502 and a low endurance (LE) zone 504. The zones differ in the WA they introduce on the traffic routed through the zone. The WA of a zone is a function of both (i) the inherent endurance of the zone, because of either use of different flash modes or different write over provisioning or different ECC methods, and (ii) the randomness characteristics of the traffic routed through the zone. Each zone is modeled using three parameters: (1) the fraction of device flash capacity ("c" for the HE zone), (2) the endurance characteristics ("e" for HE, 1 for LE), and (3) the WA ("wh" and "wl" respectively). If the HE zone 502 is constructed using a different flash mode, its effective capacity "c'" may end up being different from the raw flash capacity, "$c_r$." The aggregate system achieves a WA of "wm," by directing a fraction "f" of incoming traffic to the HE zone 502 and the remaining incoming traffic (1-f) to the LE zone 504. The model also introduces traffic flow of "x" units from the HE zone 502 to the LE zone 504, which corresponds to some data items being relocated from the HE zone 502 to the LE zone 504. As part of the normal garbage collection process, data that is identified as not very volatile, i.e., not changing rapidly, can be moved from the HE zone 502 to the LE zone 504. According to aspects of the disclosure, data can be relocated from HE zone 502 to LE zone 504 according to metrics on the usage of the HE zone. For example, if there is an unusual amount of HE zone traffic the system can decide to promote some LE zones, when the model includes more than one LE zones, into a HE zone. This can be accomplished, for example, by changing the way writes are targeted to the zone, by changing the overprovisioning for that zone, or by changing parameter settings within the device.

FIG. 5 also shows the traffic conservation equations for the system. The conservation equations shown below are derived from the model of the two-zone system and attempt to utilize the available endurance capacity of each zone, such that both zones deteriorate in proportion to their endurance. The equations allow modifying some model parameters.

The equations are reproduced below:

$$w_h f - x = w_m \left( \frac{c'e}{c'e + (1-c)} \right)$$

and $$w_l(1 - f + x) = w_m \left( \frac{(1-c)}{c'e + (1-c)} \right)$$

Table 1 shows some illustrative scenarios that utilize the model shown in FIG. 5. For each of the scenarios, the values of "c," "e," "wm," are fixed. In addition, one of the "wh" and "wl" parameters are fixed. Assuming one of "wh" and "wl" is fixed, the scenario attempts to identify for the minimum value of the other parameter (goal-seek parameter) that upon solving the traffic conservation equations, would yield valid (positive) values of "f" and "x." The goal-seek parameter for each of scenarios 1-4 is indicated in Table 1 with a (#) mark in the corresponding cell.

TABLE 1

| Model Parameters for Illustrative Scenarios | | | | | | | |
| --- | --- | --- | --- | --- | --- | --- | --- |
| Scenario | c | c' | e | $w_m$ | $w_h$ | $w_l$ | F | x |
| Base | 0.1 | 0.1 | 1 | 4.50 | 4.50 | 4.50 | 0.100 | 0.000 |
| 1 | 0.1 | 0.1 | 1 | 4.05 | 2.10 (#) | 4.50 | 0.195 | 0.005 |
| 2 | 0.1 | 0.1 | 1 | 3.00 | 4.50 | 2.80(#) | 0.076 | 0.040 |
| 3 | 0.1 | 0.05 | 4 | 3.00 | 4.50 | 2.79(#) | 0.121 | 0.001 |
| 4 | 0.1 | 0.05 | 4 | 2.25 | 4.50 | 2.02(#) | 0.092 | 0.003 |

The "base" scenario is included in order to baseline the model. The HE zone 502 uses up to 10% of the flash resources, and exposes all of the resources for use by incoming traffic. The HE and LE zones offer the same endurance and the same write amplification, and the target write amplification remains the same as in current FM3devices, which is a write amplification value of 4.5. As expected, the model computes a value of 0.1 for "f" (10% of requests directed to the HA zone), and no cross zone traffic (x=0).

Scenario 1 illustrates the requirements for achieving an improvement in overall device write amplification, if the LE zone is constrained to have the same write amplification as in state-of-the-art high performance PCIe flash SSD cards, for example, the FlashMaxII high capacity card, which means the same over provisioning and the same randomness in its traffic. To achieve a device write amplification of 4.05, which corresponds to 10% improvement over the baseline, it is desirable for the HE zone 502 to offer significantly lower write amplification. Note that write amplification levels of ~2.1 can be achieved using over provisioning in the 50% range, which given that the HE zone 502 corresponds to 10% of overall flash capacity, may well be justified. Interestingly, the HE zone 502 can receive about 20% of the incoming traffic even if it exposes, post over-provisioning, space for only 5% of the overall logical block addressing (LBA) range, i.e., the incoming access pattern needs to have 'hotness' in the sense that some blocks see higher than proportional amount of traffic and are therefore "hot". Most real-world access patterns do exhibit such behavior.

Scenario 2 illustrates the requirements for obtaining more significant WA improvements, e.g., in the 33% range. Under scenario 2, the write amplification of the HE zone to 4.5 (i.e., ~28% overprovisioning) is fixed. The model specifies that the LE zone can support significantly lower than baseline WA. Such WA levels are not practical to achieve by over-provisioning alone, because the device capacity can be reduced significantly. This scenario highlights the importance of 'filtering' out the randomness in the incoming access traffic. More random traffic can to be directed towards the HE zone 504, leaving less random traffic directed towards the LE zone. Note that this high level of randomness can be achieved at lower than proportional values of "f" (7% of traffic directed towards a zone with ~10% LBA), so may be difficult to achieve in practice.

Scenario 3 addresses this last point. The HE zone 502 is constructed using a flash mode, which increases endurance by a factor of four at the cost of exposing only 50% of the underlying capacity for use by incoming traffic. This scenario requires the LE zone 504 to achieve similar levels of write amplification as in Scenario 2. Accordingly, random traffic can be filtered out. The difference is that this scenario offers more flexibility for doing so, by directing higher than proportional traffic to the HE zone (~12% of traffic), where one can employ techniques such as generational garbage collection to move more stable/less random blocks to the LE zone 504. As with scenario 1, scenario 3 requires the underlying access pattern to exhibit hotness (~12% of traffic is directed to ~5% of the LBA space).

Scenario 4 expands on Scenario 3 and shows that significant benefits in write amplification, for example, two-fold in this case, are possible by increasing the extent to which randomness is filtered out of the traffic seen by the LE zone.

According to aspects of the disclosure, data patterns seen by the storage device are observed and those observations can be used to reduce the write amplification required. For example, most data patterns seen by the storage device can follow, for example, a Zipfian distribution. Implementing multiple endurance zones can reduce write amplification on real-world access patterns without sacrificing flash capacity, as long as the access patterns exhibit 'hotness,' or equivalently the Zipfian-ness characteristic, where most accesses are directed to a relatively small subset of the overall LBAs.

Multiple endurance zones can also reduce write amplification if the high endurance zone 502 is used to "filter" out the randomness from the traffic to allow the LE zone 504 to operate at much lower levels of write amplification than would otherwise be seen. According to aspects of the present disclosure, the HE zone can offer higher levels of endurance, even at the expense of flash capacity, compared to the LE zone. This permits the HE zone to receive more traffic from which the randomness can be filtered out.

Approaches for Creating High Endurance Zones

High endurance zones can be created by exploiting capabilities of modern-day multi-level cell (MLC) flash devices, which expose options for placing certain regions of flash into a single-level cell (SLC) mode. Such SLC modes expose 50% of the capacity from that region compared to using the flash region in MLC mode.

As an example, a 20 nm cMLC device from Micron® is organized into 8 MByte erase blocks which consist of 512 write pages each 16 Kbyte in size. These devices have the ability to be used in two modes which enhance the endurance beyond the base multi-level cell mode. The first mode is the "true SLC" mode. In this mode, a portion of the die can be reconfigured into an SLC device. For example, the portion can be restricted to the 1024 erase blocks per die. Under the true SLC mode, there are specific sequences to enter and exit the mode and some additional restrictions, which are defined by the manufacturers of the flash devices. For example, a restriction can be that once a device or a portion of it is used in a high-endurance mode, it may not be used in a low endurance mode. Under the "true SLC" mode, the endurance increases from a base of 3 k PE cycles to 30 k PE cycles. These numbers are manufacturer specified values.

The second mode can be a "pseudo SLC" mode. In this mode, the entire die remains in MLC mode and the software can restrict the use of a particular erase block to only use the lower pages. Under this mode, the endurance can increase from a base of 3 k PE cycles to 20 k PE cycles.

Of these two options, there is a bias towards using only the MLC lower pages to get an endurance gain, since this method is portable over multiple vendors and comes with fewer restrictions in terms of usage.

Embodiments of the present disclosure were discussed in connection with flash memories. Those of skill in the art would appreciate however, that the systems and methods disclosed herein are applicable to all memories that can have a variation in the error correction requirements across various portions of the array or across multiple devices.

Those of skill in the art would appreciate that the various illustrations in the specification and drawings described herein can be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware, software, or a combination depends upon the particular application and design constraints imposed on the overall system. Skilled artisans can implement the described functionality in varying ways for each particular application. Various components and blocks can be arranged differently (for example, arranged in a different order, or partitioned in a different way) all without departing from the scope of the subject technology.

Furthermore, an implementation of the communication protocol can be realized in a centralized fashion in one computer system, or in a distributed fashion where different elements are spread across several interconnected computer systems. Any kind of computer system, or other apparatus adapted for carrying out the methods described herein, is suited to perform the functions described herein.

A typical combination of hardware and software could be a general purpose computer system with a computer program that, when being loaded and executed, controls the computer system such that it carries out the methods described herein. The methods for the communications protocol can also be embedded in a computer program product, which comprises all the features enabling the implementation of the methods described herein, and which, when loaded in a computer system is able to carry out these methods.

Computer program or application in the present context means any expression, in any language, code or notation, of a set of instructions intended to cause a system having an information processing capability to perform a particular function either directly or after either or both of the following a) conversion to another language, code or notation; b) reproduction in a different material form. Significantly, this communications protocol can be embodied in other specific forms without departing from the spirit or essential attributes thereof, and accordingly, reference should be had to the following claims, rather than to the foregoing specification, as indicating the scope of the invention.

The communications protocol has been described in detail with specific reference to these illustrated embodiments. It will be apparent, however, that various modifications and changes can be made within the spirit and scope of the disclosure as described in the foregoing specification, and such modifications and changes are to be considered equivalents and part of this disclosure.

What is claimed is:

1. A storage device, comprising:
one or more memories; and
one or more controllers configured to cause:
allocating first blocks of the one or more memories to a first zone and second blocks of the one or more memories to a second zone;
assigning a first error correction mechanism to the first zone and a second error correction mechanism to the second zone;
directing first write requests to the one or more memories into the first zone and second write requests into the second zone, wherein the first write requests are for data that is overwritten more frequently than data for the second write requests;
re-directing at least one write request from the first write requests into the second zone; and
filtering out write requests with random traffic patterns from the second zone.

2. The storage device of claim 1, wherein the one or more controllers are configured to cause:
allocating third blocks of the one or more memories to a third zone;
assigning the second error correction mechanism to the third zone;
receiving third write requests, wherein the third write requests are for data that is overwritten more frequently than data for the second write requests;
changing an error correction mechanism of the third zone by assigning the first error correction mechanism to the third zone; and
directing the third write requests into the third zone.

3. The storage device of claim 1, wherein the one or more controllers are configured to cause re-allocating a block from the first blocks from the first zone to the second zone, when the block has an error count higher than a threshold error count.

4. The storage device of claim 1, wherein the one or more controllers are configured to cause re-allocating a block from the second blocks from the second zone to the first zone, when the block has an error count lower than a threshold error count.

5. The storage device of claim 1, wherein the one or more controllers are configured to cause:
assigning, to the first zone, a first error correction level associated with the first error correction mechanism; and
assigning to the second zone a second error correction level associated with the second error correction mechanism.

6. The storage device of claim 5, wherein the one or more controllers are configured to cause:
re-assigning, to the first zone, the first error correction mechanism and a third error correction level,
wherein the first error correction mechanism and the third error correction level provide higher error correction than the first error correction mechanism and the first error correction level.

7. The storage device of claim 5, wherein the one or more controllers are configured to cause:
re-assigning, to the first zone, a third error correction mechanism and the first error correction level,
wherein the third error correction mechanism and the first error correction level provide higher error correction than the first error correction mechanism and the first error correction level.

8. The storage device of claim 1,
wherein write requests of the first write requests are to generate higher write amplification than write requests of the second write requests.

9. The storage device of claim 1, wherein the one or more memories are a multi-level cell flash device, and wherein the one or more controllers are configured to cause:
dividing the multi-level cell flash device into at least one region; and
assigning the first zone into the at least one region that is in a single-level cell mode.

10. The storage device of claim 1,
wherein the first zone is configured to support a larger number of program/erase cycles compared to the second zone by limiting programming to lower pages in the first zone.

11. A method, comprising:
allocating first blocks of one or more memories to a first zone and second blocks of the one or more memories to a second zone;
assigning a first error correction mechanism to the first zone and a second error correction mechanism to the second zone;
directing first write requests to the one or more memories into the first zone and second write requests into the second zone, wherein the first write requests are for data that is overwritten more frequently than data for the second write requests; and
re-directing at least one write request from the first write requests into the second zone;
filtering out write requests with random traffic patterns from the second zone.

12. The method of claim 11, comprising:
allocating third blocks of the one or more memories to a third zone;
assigning the second error correction mechanism to the third zone;
receiving third write requests, wherein the third write requests are for data that is overwritten more frequently than data for the second write requests;
changing an error correction mechanism of the third zone by assigning the first error correction mechanism to the third zone; and
directing the third write requests into the third zone.

13. The method of claim 11, comprising: re-allocating a block from the first blocks from the first zone to the second zone, when the block has an error count higher than a threshold error count.

14. The method of claim 11, comprising:
assigning, to the first zone, a first error correction level associated with the first error correction mechanism; and
assigning, to the second zone, a second error correction level associated with the second error correction mechanism.

15. The method of claim 14, comprising:
re-assigning, to the first zone, the first error correction mechanism and a third error correction level,
wherein the first error correction mechanism and the third error correction level provide higher error correction than the first error correction mechanism and the first error correction level.

16. The method of claim 14, comprising:
re-assigning, to the first zone, a third error correction mechanism and the first error correction level,
wherein the third error correction mechanism and the first error correction level provide higher error correction than the first error correction mechanism and the first error correction level.

17. An apparatus, comprising:
means for allocating first blocks of one or more memories to a first zone and second blocks of the one or more memories to a second zone;
means for assigning a first error correction mechanism to the first zone and a second error correction mechanism to the second zone;
means for directing first write requests to the one or more memories into the first zone and second write requests into the second zone, wherein the first write requests are for data that is overwritten more frequently than data for the second write requests;
means for re-directing at least one write request from the first write requests into the second zone; and
means for filtering out write requests with random traffic patterns from the second zone.

18. The apparatus of claim 17, comprising:
means for allocating third blocks of the one or more memories to a third zone;
means for assigning the second error correction mechanism to the third zone;
means for receiving third write requests, wherein the third write requests are for data that is overwritten more frequently than data for the second write requests;
means for changing an error correction mechanism of the third zone by assigning the first error correction mechanism to the third zone; and
means for directing the third write requests into the third zone.

* * * * *